United States Patent [19]

Daly

[11] Patent Number: 5,165,962

[45] Date of Patent: Nov. 24, 1992

[54] MASKING FILM COMPOSITION AND METHOD OF MASKING AN ARTICLE USING SAME

[75] Inventor: Richard K. Daly, Greer, S.C.

[73] Assignee: Westinghouse Air Brake Company, Wilmerding, Pa.

[21] Appl. No.: 709,461

[22] Filed: May 31, 1991

[51] Int. Cl.$^5$ .................. B05D 7/22; B05D 1/32; C09K 3/00
[52] U.S. Cl. ................... 427/235; 427/259; 427/282; 106/287.34
[58] Field of Search .............. 208/20, 21; 252/28; 174/23 C; 106/287.34; 427/235, 259, 282

[56] References Cited

U.S. PATENT DOCUMENTS

| | | | |
|---|---|---|---|
| 2,957,779 | 10/1960 | Bolton | 427/259 X |
| 3,875,323 | 4/1975 | Bopp et al. | 174/23 C |
| 4,366,075 | 12/1982 | Beach | 252/28 |

*Primary Examiner*—Evan Lawrence
*Attorney, Agent, or Firm*—J. O. Ray, Jr.

[57] ABSTRACT

A masking film composition and method of masking a surface of an article to be coated with a protective coating, wherein a selected surface first is coated with a masking film consisting essentially of from over an approximate volume ratio of about 1:12, preferably about 1:4 of a fumed, colloidal silica, balance petrolatum, then applying and drying the protective coating, and then removing the masking film with a mild solvent naphtha.

9 Claims, No Drawings

MASKING FILM COMPOSITION AND METHOD OF MASKING AN ARTICLE USING SAME

CROSS-REFERENCES TO RELATED APPLICATIONS

This application is related to co-pending application Ser. No. 641,437, filed Jan. 15, 1991, entitled "Apparatus and Method for Liquid Treatment of Article Surfaces," and to copending Ser. No. 07/708,148, filed May 31, 1991, now abandoned, entitled "Method of Masking a Bore Surface During Liquid Treatment of a Component Containing the Bore," both filed in the name of the present inventor, and both assigned to the assignee of the present application, and both such applications being incorporated herein by reference.

FIELD OF THE INVENTION

This invention relates to compositions and methods for masking portions of articles, especially metal articles, to be provided with surface coatings, such as paints, lacquers, enamels and other protective coatings, surface treating solutions and the like. Masking films prevent adherence of coating materials to the coated substrate and thereby provide a convenient means for obtaining desired functional treatment or visual design patterns.

BACKGROUND OF THE INVENTION

The advantages of using a masking film in the coating industry to control unwanted application of coating media to selected metal and other surfaces have long been recognized.

Such advantages include, but are not limited to, coating cost reduction, for example, by using thin, low viscosity film-producing materials which are easily applied, e.g. by dipping or spraying, and which repel adhesion of applied coatings but which are readily removed after the coating operation has been completed.

A major problem which has been encountered with use of prior art masking films for dip coating processes is the tendency for highly viscous petroleum products-containing films to wash off during vigorous dip coating cycles, with consequent contamination of the coating product. Such wash-off effect can be eliminated by increasing the viscosity of the masking film; however, this also increases resistance of the film to removal after coating. Solvents which aid in removing low viscosity films also tend to remove the desired protective coatings. Examples of prior art masking films and their shortcomings include:

| Wax | must be applied at comparatively high temperature; must make contact with the surface to be masked by brushing; difficult to remove without covering other parts of the product being treated. |
| Plating mask | dries hard; is plastic-like; material flows into small holes, forming nipples which break off during revoval, causing holes to remain plugged; material becomes lodged in deep blind bushing bores. |
| Solder Mask | used by the electronics industry to mask electronic boards; generally painted on, but washes off with water; once paint is applied over the top of this masking material it seals in the masking which then is difficult or impossible to remove. |

OBJECTS OF THE INVENTION

Therefore, it is an object of this invention to provide a masking film composition and method of using the same wherein the film has low viscosity that will resist undesirable the coating process and which can be removed easily in a mild solvent while having no effect on an applied dip coating.

SUMMARY OF THE INVENTION

In accordance with such object, a masking film composition of the present invention comprises only two readily available and relatively inexpensive ingredients, i.e. petrolatum and fumed silica powder.

Masking methods using this composition provide the advantages of conventional light masking films while providing ease of application and removal and reducing undesired wash-off characteistics of materials previously used for such purposes.

DETAILED DESCRIPTION OF THE INVENTION

Petrolatum is a mixture of hydrocarbons refined from petroleum. For purposes of this invention, petrolatum of USP grade is useful. Such material is obtainable, for example, from Sonneborn Division, Witco Corp., Petrolia, Pa. 16050. This material is an odorless, opaque white semi-solid of 0.815–0.880 specific gravity, having a melting point of 100.4°–140.0° F. and flash point between 199° and 390° F. as determined by ASTM-D-92 test.

Fumed, or colloidal, silica is an amorphuous silica in the form of a fluffy white, odorless and non-flammable powder which has a specific gravity of 2.2 and is non-soluble in water. Such material can be obtained, for example, from Wacker Chemie GmbH, Munich, Germany or its U.S. affiliate, Wacher Chemicals (USA), Inc. (grade designation "Fumed Silica HDK H 20"), or from Cabot Corp., Billerica, Mass. 01821 ("CABO-SIL," a trademark of Cabot).

The compositions of this invention have good shape retention (fixtropy) when applied as masking films to surfaces such as metal surfaces to be painted or treated with other protective coating or treated with other oil- or water-based materials. Such masking film products advantageously may have compositions within those ingredient range of the following Table showing good shape retention:

TABLE 1

| Silica, ml. | Petrolatum, ml. | approx. volume ratio | Comments |
| --- | --- | --- | --- |
| 6 | 75 | 1:12 | minimum shape retention |
| 18 | 75 | 1:4 | ideal shape retention |
| 24 | 75 | 1:3 | same |
| 30 | 75 | 1:2.5 | same |
| 36 | 75 | 1:2 | poor retention; excess flaking and separation like very dry pastry dough |

The Table 1 composition having the lowest silica range is smooth, but it does not have sufficient body or viscosity to retain its shape or to press into small holes or other voids, and it will "wash out" during the dip process, resulting in poor or no effective masking action.

Excessively high proportions of silica will cause the mixture to become too dry for easy application; the material is nhot smooth, must be forced into small holes and other voids, and requires more rigorous cleaning action during removal of the masking film.

On the other hand, the compositions showing "ideal range" provides good shape retention, smooth flow and easily flows into small holes and other voids in the surfaces being masked.

Accordingly, a volume ratio of silica to petrolatum of more than 1:12 and especially about 1:4 to about 1:2.5 is preferred.

When the two ingredients of this composition are mixed, the resulting product is of a thick grease-like consistency with high fixtropy. When applied to, e.g., metal surfaces, as a masking film, the composition retains its shape, coats evenly and repels various dip coatings.

After the dip coating medium has adequately dried, the masking film is easily removed by applying to the coated article a suitable remover, for example by spraying or immersion of the coated article Various petroleum-derived hydrocarbon distillate fractions are useful for such purpose. However, it is important to select a remover which is not so aggressive in solvent action as to attack to protective coating and yet which has sufficient solvent strength to remove the masking film. An example of a too aggressive solvent is petroleum-based paint thinner. On the other hand, mineral spirits is not strong enough in solvent action to remove the masking film.

The products those commonly referred to as naphthas or solvent naphthas, are useful for such purpose, for example, the mild solvent known as V.M & P. Naphtha. Such product can be obtained, for example, from Piedmont Paint Manufacturing Division, Whittaker Corporation, Greenville, S.C. Such product has a boiling point of 240°-285° F. at 760 mm Hg; a vapor pressure of about 15 mm Hg at 100° F., a specific gravity of 3.8 (air = 1.0), is composed of 100% volatiles and has an evaporation rate of 9.20 (ether = 1.0). On treating the dried protectively coated article with such masking film removers, the masking composition is effectively removed into suspension in the naphtha, and there is no measurable effect on the coating medium.

The masking film compositions of the invention are particularly useful in connection with the dip coating of metal surfaces with paints. For example, my pending U.S. application Ser. No. 641,437 for "Apparatus and Method for Liquid Treatment of Article Surfaces," filed January 15, 1991, describes an apparatus and method for paint-coating articles by rotating the articles in two axes of roatation for more effective coating, particularly of metal articles such as castings and worked equipment components having a plurality of cast or drilled internal passageways which otherwise can be coated only ineffectively and with great difficulty. My copending U.S. patent application for "Method of Masking a Bore Surface During Liquid Treatment of a Component Containing the Bore," more particularly describes a masking plug for use in the coating of such articles having difficultly-coatable internal passageways, for example, railroad brake apparatus. As described therein, a masking film is especially useful for coating the outer surfaces of such masking plugs so as to seal small gaps purposely provided between such outer plug surfaces and the surfaces of internal passageways into which the plug is inserted to mask the passageway against unwanted entry of coating medium.

The compositions of the invention also may be usefully applied to various plastic surfaces to be masked against deposition thereon of coatings applied thereto.

The inventive compositions may be applied by hand, since they are non-corrosive and otherwise generally environmentally safe in case of human contact. They also may be applied by brush or by roller in the case of large surfaces to be masked.

What is claimed is:

1. A masking film composition consisting essentially of fumed silica and petrolatum wherein said fumed silica is present in said composition in an approximate volume ratio of between about more than 1:12 and about 1:2.5.

2. A composition according to claim 1, wherein the fumed silica content is from about 1:4 volume ratio to about 1:2.5 volume ratio, balannce petrolatum.

3. A method of masking an article during treatment thereof with a protective coating, comprising applying to an article surface to be masked against deposit of the protective coating a masking film containing fumed silica powder and petrolatum.

4. A method according to claim 3, further comprising selecting the fused silica content present in the composition within an appropriate volume ratio range of from more than 1:12 to about 1:2.5, balance petrolatum.

5. A method according to claim 4, comprising limiting the minimum amount of silica to about 1:4 volume ratio.

6. A method according to claim 3, further comprising removing the masking film after coating by treating the article with a naphtha liquid hydrocarbon petroleum distillate in which the protective coating is substantially insoluble.

7. A method according to claim 4, further comprising removing the masking film after coating by treating the article with a naphtha liquid hydrocarbon petroleum distillate in which the protective coating is substantially insoluble.

8. A method according to claim 5, further comprising removing the masking film after coating by treating the article with a naphtha liquid hydrocarbon petroleum distillate in which the protective coating is substantially insoluble.

9. A method of protecting a surface of an internal passageway of an article during application of a protective coating to the article wherein, during such application, a portion of the passageway the surface of which is to be protected from exposure to the protective coating is blocked by insertion therein of a masking plug having a maximum dimension smaller than that of the passageway into which the plug is inserted, which method comprises:
   a. applying to the exterior of the plug a masking composition consisting essentially of fumed silica and petrolatum;
   b. inserting the coated plug into such portion of the article passageway, thereby providing a film of such masking composition in a gap between the plug and the thus-juxtaposed surface of such portion of the article passageway,
   c. applying a protective coating to the article;
   d. drying the thus-applied protective coating;
   e. removing the plug from such portion of the article passageway, and
   f. removing the masking film by treating the coated article with a naphtha in which the protective coating is essentially insoluble.

* * * * *

UNITED STATES PATENT AND TRADEMARK OFFICE
CERTIFICATE OF CORRECTION

PATENT NO. : 5,165,962
DATED : November 24, 1992
INVENTOR(S) : Richard K. Daly

It is certified that error appears in the above-identified patent and that said Letters Patent is hereby corrected as shown below:

Column 1, line 10, delete "copending" and insert --co-pending--;

line 10, after copending, insert --application--.

Column 2, line 11, after undesirable, insert --wash-off during--;

line 19, delete "provide" and insert --provides--;

line 22, delete "charasteistics" and insert

--characteristics--;

line 34, delete "°", first occurrence;

line 35, delete "°", first occurrence;

line 52, delete "range " and insert --ranges --.

UNITED STATES PATENT AND TRADEMARK OFFICE
CERTIFICATE OF CORRECTION

PATENT NO. : 5,165,962

DATED : November 24, 1992

INVENTOR(S) : Richard K. Daly

It is certified that error appears in the above-identified patent and that said Letters Patent is hereby corrected as shown below:

Column 3, line 8, delete "nhot" and insert --not--;

line 26, after article, insert --.--;

line 30, delete "to" (2nd Occurrence) and insert --the --.

line 36, delete "those" and insert --which are most--;

line 42, delete "°", first occurrence;

line 43, delete ".";

line 57, delete "roatation" and insert --rotation--.

Column 4, line 19, delete "balannce" and insert --balance--.

Signed and Sealed this

Sixteenth Day of November, 1993

BRUCE LEHMAN

Commissioner of Patents and Trademarks